United States Patent
Li et al.

(10) Patent No.: US 10,818,741 B2
(45) Date of Patent: Oct. 27, 2020

(54) OLED ARRAY SUBSTRATE, METHOD FOR FABRICATING THE SAME, AND LIGHT EMITTING DIODE DISPLAY

(71) Applicant: BOE TECHNOLOGY GROUP CO., LTD., Beijing (CN)

(72) Inventors: Dong Li, Beijing (CN); Boris Kristal, Beijing (CN); Yuanming Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/215,886

(22) Filed: Dec. 11, 2018

(65) Prior Publication Data
US 2019/0288226 A1    Sep. 19, 2019

(30) Foreign Application Priority Data
Mar. 15, 2018 (CN) ........................... 2018 1 0213261

(51) Int. Cl.
*H01L 27/32* (2006.01)
*H01L 51/50* (2006.01)
(Continued)

(52) U.S. Cl.
CPC ............ *H01L 27/326* (2013.01); *H01L 27/32* (2013.01); *H01L 27/3258* (2013.01);
(Continued)

(58) Field of Classification Search
CPC ............. H01L 51/0001; H01L 51/0002; H01L 51/0014; H01L 51/0015; H01L 51/0016; H01L 51/0017; H01L 51/0018; H01L 51/0021; H01L 51/0023; H01L 51/52; H01L 51/5209; H01L 27/32; H01L 27/3202; H01L 27/3223; H01L 27/3258;
(Continued)

(56) References Cited

U.S. PATENT DOCUMENTS

2008/0061686 A1* 3/2008 Liu ...................... C09K 11/06
                                                              313/506
2014/0374705 A1   12/2014 Song et al.
(Continued)

FOREIGN PATENT DOCUMENTS

CN        102064278 A      5/2011
CN        104411694 A      3/2015
(Continued)

OTHER PUBLICATIONS

First Office Action for Chinese Patent Application No. 201810213261.X dated Jun. 26, 2019.

*Primary Examiner* — Eduardo A Rodela
(74) *Attorney, Agent, or Firm* — Calfee, Halter & Griswold LLP (57) ABSTRACT

An OLED array substrate includes a plurality of pixel structure, including a plurality of pixel units, each of the plurality of pixel units including: a base substrate; a first electrode disposed above the base substrate; a light emitting layer disposed on a side of the first electrode facing away from the base substrate; a second functional layer disposed on a side of the light emitting layer facing away from the base substrate, wherein the second functional layer wraps the light emitting layer.

16 Claims, 4 Drawing Sheets

(51) Int. Cl.
*H01L 51/52* (2006.01)
*H01L 51/56* (2006.01)

(52) U.S. Cl.
CPC ............ *H01L 51/50* (2013.01); *H01L 51/502* (2013.01); *H01L 51/508* (2013.01); *H01L 51/5056* (2013.01); *H01L 51/5064* (2013.01); *H01L 51/5068* (2013.01); *H01L 51/5072* (2013.01); *H01L 51/5084* (2013.01); *H01L 51/5088* (2013.01); *H01L 51/5092* (2013.01); *H01L 51/52* (2013.01); *H01L 51/5209* (2013.01); *H01L 51/5225* (2013.01); *H01L 51/56* (2013.01); *H01L 27/3246* (2013.01)

(58) Field of Classification Search
CPC . H01L 51/50; H01L 51/5064; H01L 51/5068; H01L 51/5072; H01L 51/508; H01L 51/5084; H01L 27/326
See application file for complete search history.

(56) References Cited

U.S. PATENT DOCUMENTS

| | | | | |
|---|---|---|---|---|
| 2016/0155784 | A1* | 6/2016 | Park | H01L 27/3246 257/88 |
| 2016/0155787 | A1* | 6/2016 | Lee | H01L 51/5262 257/72 |
| 2017/0125731 | A1* | 5/2017 | Yun | H01L 51/5253 |
| 2018/0018907 | A1* | 1/2018 | Kim | G09F 9/301 |
| 2018/0033967 | A1* | 2/2018 | Bang | H01L 27/3246 |
| 2018/0197929 | A1* | 7/2018 | Cho | H01L 27/3258 |
| 2018/0248045 | A1* | 8/2018 | Lim | H01L 29/7869 |

FOREIGN PATENT DOCUMENTS

| | | |
|---|---|---|
| CN | 105576145 A | 5/2016 |
| CN | 105742521 A | 7/2016 |

\* cited by examiner

OLED ARRAY SUBSTRATE, METHOD FOR FABRICATING THE SAME, AND LIGHT EMITTING DIODE DISPLAY

CROSS-REFERENCE TO RELATED APPLICATIONS

The present application claims priority to Chinese Patent Application No. 201810213261.X and filed Mar. 15, 2018, the entire contents of which are incorporated herein by reference.

TECHNICAL FIELD

The present disclosure relates to the field of display technology, and more particularly, to an OLED array substrate, a method for fabricating the same, and a light emitting diode display.

BACKGROUND

With the rapid development of organic materials and quantum dot materials, Organic Light Emitting Diode (OLED) and Quantum Dot Light Emitting Diode (QLED) are experiencing rapid development.

On one hand, Active Matrix Organic Light Emitting Diodes (AMOLEDs) have been recognized as a new generation of displays that are expected to replace Liquid Crystal Displays (LCDs), and are usually manufactured by employing vacuum evaporation or printing technologies. At present, small molecule vacuum evaporation technology has been mature and industrialized, but the equipment investment and maintenance cost of the technology is relatively high, and material waste is serious. With the development of high-resolution display devices, high-resolution OLED display devices need to be manufactured by means of mask evaporation, which inevitably has the problem of alignment accuracy, but OLED masks used in the evaporation will reduce a line width of a mask process, thereby limiting the further improvement of resolution.

On the other hand, Active Matrix Quantum Dot Light Emitting Diode (AMQLED) has received extensive attention due to its potential advantages such as wide color gamut and long service life, the study of the AMQLED is getting intensive, and the quantum efficiency is also increasingly improving. the adoption of new process technologies to achieve the industrialization of the AMQLED is a future trend. Based on the characteristics of the quantum dot materials, which are generally manufactured by means of printing or jet printing, which can effectively solve the problem of material utilization and enable large-area fabrication. However, the use of inkjet printing processes requires pre-preparation of a pixel defining layer, and ink of functional layers will cause the problem of climbing on the pixel defining layer, thereby greatly affecting film morphology and thickness uniformity. When a high-resolution backplane is fabricated, since a size of a region defined by the pixel defining layer is too small, there are extremely high requirements on accuracy and stability of the device, and thus the improvement of resolution is limited.

Based on the problem of limitation of resolution above-described, the existing technology may first fabricate a common bottom layer film, and then apply a photoresist material on the common bottom layer film, to be exposed and developed so as to separately fabricate three pixel structures light emitting layers of red, green and blue. A high-resolution pixel structure is then formed immediately following the preparation of a common top layer film. However, such a pixel structure has a serious signal crosstalk problem due to the relatively close distance between adjacent pixel structures, thereby affecting the display effect of the display devices. However, if the method of pre-preparing the pixel defining layer is used to eliminate signal crosstalk, the problem of non-uniform film may be caused because of a large height of the pixel defining layer.

It should be noted that the foregoing information disclosed in Background are only for the purpose of enhancement of the understanding of the background of the present disclosure and therefore the information can include information that does not constitute the prior art already known to those of ordinary skill in the art.

SUMMARY

Other characteristics and advantages of the present disclosure will be apparent from the following detailed descriptions, or may be partially learned by practice of the present disclosure.

According to an aspect of the present disclosure, there is provided an OLED array substrate including a plurality of pixel units, each of the plurality of pixel units comprising:
a base substrate;
a first electrode disposed above the base substrate;
a light emitting layer disposed on a side of the first electrode facing away from the base substrate;
a second functional layer disposed on a side of the light emitting layer facing away from the base substrate, wherein, the second functional layer wraps the light emitting layer.

In an exemplary embodiment of the present disclosure, the second functional layer comprising an anode or cathode.

In an exemplary embodiment of the present disclosure, the second functional layer further comprising at least one of an electron injection layer, an electron transport layer, a hole injection layer and a hole transport layer.

In an exemplary embodiment of the present disclosure, the light emitting layer comprises a photocurable functional group or a photodegradable group.

In an exemplary embodiment of the present disclosure, the light emitting layer comprises a quantum dot light emitting layer.

In an exemplary embodiment of the present disclosure, wherein the photocurable functional group comprises one or more of an alkenyl group, an alkynyl group, a carbonyl group, a sulfhydryl group, and a hydroxyl group.

In an exemplary embodiment of the present disclosure, wherein the photodegradable group comprises a metal-organic frame or a carbonyl group on a long molecular chain.

In an exemplary embodiment of the present disclosure, wherein the second functional layer further comprises:
the electron transport layer disposed between the first electrode and the light emitting layer, the electron transport wrapping the first electrode, the electron injection layer disposed between the first electrode and the electron transport layer, the electron transport wrapping the electron injection layer, the hole transport layer disposed on a side of the light emitting layer facing away from the base substrate, the hole transport layer wrapping the light emitting layer, the hole injection layer disposed between the hole transport layer and a second electrode, and the second electrode disposed on a side of the hole injection layer facing away from the base substrate.

In an exemplary embodiment of the present disclosure, wherein a material of the electron injection layer, the electron transport layer, the hole injection layer and the hole transport layer comprises a photocurable functional group or a photodegradable group.

In an exemplary embodiment of the present disclosure, wherein the photocurable functional group comprises one or more of an alkenyl group, an alkynyl group, a carbonyl group, a sulfhydryl group, and a hydroxyl group.

In an exemplary embodiment of the present disclosure, wherein the photodegradable group comprises a metal-organic frame or a carbonyl group on a long molecular chain.

According to an aspect of the present disclosure, there is provided a light emitting diode display, comprising the above described OLED array substrate.

In an exemplary embodiment of the present disclosure, wherein, each of the plurality of the pixel structure further comprises:

an electron transport layer disposed between the first electrode and the light emitting layer, the electron transport wrapping the first electrode, an electron injection layer disposed between the first electrode and the electron transport layer, the electron transport wrapping the electron injection layer, a hole transport layer disposed on a side of the light emitting layer facing away from the base substrate, the hole transport layer wrapping the light emitting layer, a hole injection layer disposed between the hole transport layer and a second electrode, and the second electrode disposed on a side of the hole injection layer facing away from the base substrate.

In an exemplary embodiment of the present disclosure, wherein thicknesses of each of second functional layers in the plurality of pixel structure are not exactly the same; and the second functional layers comprise the electron injection layer, the electron transport layer, the hole injection layer and the hole transport layer.

According to an aspect of the present disclosure, there is provided a method for fabricating an OLED array substrate, comprising:

forming a first electrode on a base substrate;

forming a light emitting layer on a side of the first electrode facing away from the base substrate;

forming a second functional layer on a side of the light emitting layer facing away from the base substrate; wherein the second functional layer wraps the light emitting layer.

In an exemplary embodiment of the present disclosure, wherein the light emitting layer is formed of a photocurable functional group or a photodegradable group.

In an exemplary embodiment of the present disclosure, wherein the light emitting layer is formed using a photolithography process.

In an exemplary embodiment of the present disclosure, wherein the second functional layer comprising an anode or cathode.

In an exemplary embodiment of the present disclosure, the second further comprising at least one of an electron injection layer, an electron transport layer, a hole injection layer and a hole transport layer.

In an exemplary embodiment of the present disclosure, wherein the first transport layer, the second transport layer, the first injection layer, and the second injection layer are formed using a photolithography process.

It shall be understood that the above general description and the following detailed description are merely exemplary and explanatory and are not intended to be restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. It will be obvious that the drawings in the following descriptions are some embodiments of the present disclosure only, and those ordinary skilled in the art may obtain other drawings form these drawings without paying any creative labor.

DETAILED DESCRIPTION

The exemplary embodiments will now be described more fully with reference to the accompanying drawings. However, the exemplary embodiments can be implemented in various forms and should not be understood as being limited to the examples set forth herein; rather, these embodiments are provided so that this disclosure will be thorough and complete, and the conception of exemplary embodiments will be fully conveyed to those skilled in the art. The features, structures or characteristics described herein may be combined in one or more embodiments in any suitable manner.

In addition, the drawings are merely schematic illustrations of the present disclosure and are not necessarily drawn to scale. The same reference numerals in the drawings refer to same or similar parts, and the repeated descriptions thereof will be omitted. Some of the block diagrams shown in the drawings are functional entities and do not necessarily correspond to physically or logically separate entities. These functional entities may be implemented in software, or implemented in one or more hardware modules or integrated circuits, or implemented in different networks and/or processor devices and/or microcontroller devices.

The present exemplary embodiment provides an OLED array substrate, the OLED array substrate is used to, for example, an OLED display, a light emitting layer of which may be an organic light emitting layer, or for another example, the pixel structure is a QLED display, a light emitting layer of which may be a quantum dot light emitting layer.

According to an aspect of the present disclosure, there is provided an OLED array substrate including a plurality of pixel units, each of the plurality of pixel units comprising: a base substrate; a first electrode disposed above the base substrate; a light emitting layer disposed on a side of the first electrode facing away from the base substrate; a second functional layer disposed on a side of the light emitting layer facing away from the base substrate, wherein, the second functional layer wraps the light emitting layer.

The second functional layer includes an anode or cathode. While the organic light emitting diode has a bottom emission structure, the second functional layer includes a cathode. While the organic light emitting diode has a top emission structure, the second functional layer includes an anode.

The second functional layer further includes at least one of an electron injection layer, an electron transport layer, a hole injection layer and a hole transport layer.

Figure 1:
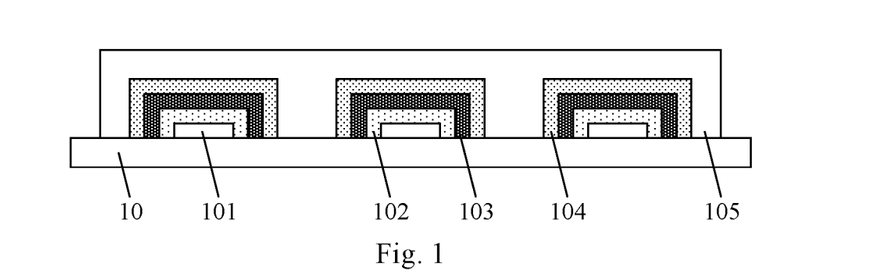
FIG. 1 is a structural schematic diagram schematically illustrating a pixel structure according to an exemplary embodiment of the present disclosure.
Figure 2:
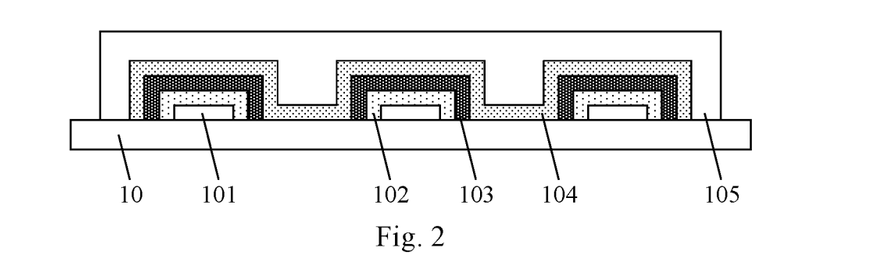
FIG. 2 is a structural schematic diagram schematically illustrating a pixel structure according to an exemplary embodiment of the present disclosure.

In an exemplary embodiment, as shown in FIGS. 1 and 2, the pixel structure may include:

a base substrate 10 on which a thin film transistor array can be disposed;

a plurality of first electrodes 101 disposed above the base substrate 10, the plurality of first electrodes 101 corresponding to different pixel structures;

a first transport layer 102 disposed above the first electrode 101, the first transport layer 102 being coated on a side of the first electrode 101 facing away from the base substrate 10;

a light emitting layer 103 disposed above the first transport layer 102, the light emitting layer 103 being coated on a side of the first transport layer 102 facing away from the base substrate 10;

a second transport layer 104 disposed above the light emitting layer 103, the second transport layer 104 being coated on a side of the light emitting layer 103 facing away from the base substrate 10; and a second electrode 105 disposed on a side of the second transport layer 104 facing away from the base substrate 10, the second electrode 105 being paved on an entire surface of the substrate.

One of the first transport layer 102 and the second transport layer 104 may be an electron transport layer, and the other of them may be a hole transport layer. For example, the first transport layer 102 is an electron transport layer, and the second transport layer 104 is a hole transport layer; or the first transport layer 102 is a hole transport layer, and the second transport layer 104 is an electron transport layer.

The above described structure is merely an example, and the pixel structure may include both an electron transport layer and a hole transport layer. The pixel structure may include only the electron transport layer or the hole transport layer. That is, the second functional layer may include one of the electron transport layer and the hole transport layer.

It should be noted that in this embodiment, the structure located above the light emitting layer 103, for example, the second transport layer 104, may also be a paved structure, namely, may be paved on a surface of the underlying structure.

In this exemplary embodiment, a layer of structure is coated on another layer of structure refers to a situation in which a thin-film size of the upper structure is larger than a thin-film size of the lower structure in various directions parallel to the surface of the base substrate 10. For example, the upper structure is 500-1000 nm larger than the lower structure, so that the upper structure is coated on the outside of the lower structure in directions other than the side of the lower structure on the base substrate 10, in this way, a structure like a lid covering a box body is formed, for example. For convenience of description, the form of a layer of structure coated on another layer of structure is hereinafter referred to as a cladding structure, and the form of paving a whole layer of film is referred to as a paved structure.

With the OLED array substrate provided by the exemplary embodiment of the present disclosure, no pixel defining layer needs to be fabricated, rather, a structure in which the light emitting layer 103 is covers the first transport layer 102 and the first transport layer 102 is coated on the first electrode 101 is formed, in this way, a high-resolution pixel structure is formed, meanwhile, this, on one hand, solves the problem of signal crosstalk in a high-resolution display, thereby improving display quality, and on the other hand, avoids the problem of non-uniform film thickness caused by the pixel defining layer, thereby improving product yield.

In an exemplary embodiment, the light emitting layer 103 includes a quantum dot light emitting layer.

In an exemplary embodiment, the material of the light emitting layer 103 includes photocurable functional group or photodegradable group.

The photocurable functional group may produce crosslinking reaction under illumination conditions such as under irradiation of ultraviolet light. The photocurable functional group is, for example, one or more of alkenyl, dienyl, alkynyl, diynyl, phenyl, carbonyl, sulfydryl, which produce photocuring reaction to form a crosslinked network structure, thereby performing the function of material fixation.

When the light emitting layer 103 is formed using a material including photocurable functional group, firstly, a film layer of a photocurable functional group is formed on the first transport layer 102, and the film layer is covered with a mask with pattern. Then, ultraviolet light irradiation treatment is performed on the mask. The portion covered by the mask is not cured due to the protection of the mask, and the portion not covered by the mask is cured by ultraviolet light. After the subsequent solvent treatment, the cured portion is maintained on the first transport layer 102 and formed as the light emitting layer 103. As the light emitting layer is formed by using a material including a photocurable functional group, the light-emitting layer can be formed by a photolithography process, so that expensive evaporation processes are not required. In addition, in the photolithography process, since the material including photocurable functional group is used, the use of a photoresist is not required, thereby further reducing cost and process complexity.

In an exemplary embodiment, the material of the light emitting layer 103 includes photodegradable group. The photodegradable group may produce chain scission or degradation reaction under illumination conditions such as under irradiation of ultraviolet light. The photodegradable group is, for example, a metal-organic frame, a carbonyl group, an epoxy group on a long-chain molecule, which may undergo photodegradable reaction but cannot form a crosslinked network structure, thereby failing to perform the function of curing.

When the light emitting layer 103 is formed using a material including photodegradable group, firstly, a film layer of a photodegradable group is formed on the first transport layer 102, and the film layer is covered with a mask with pattern. Then, ultraviolet light irradiation treatment is performed on the mask. The portion covered by the mask is not degraded due to the protection of the mask, and the portion not covered by the mask is degraded by ultraviolet light. After the subsequent solvent treatment, the undegraded portion is maintained on the first transport layer 102 and formed as the light emitting layer 103. As the light emitting layer is formed of a material including photodegradable group, a photolithography process can be adopted for the fabrication of the light emitting layer, so that expensive evaporation processes are not required. In addition, in the photolithography process, since the material including photodegradable group is used, the use of a photoresist is not required, thereby further reducing cost and process complexity.

Figure 6:
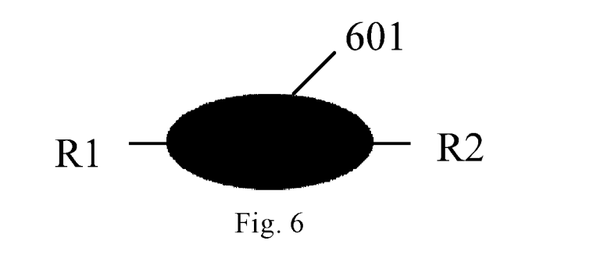
FIG. 6 is a structure diagram schematically illustrating a material of a transport layer and a material of a light emitting layer according to an exemplary embodiment of the present disclosure.

A structure of a material of the light emitting layer 103 is as shown in FIG. 6, wherein the middle part 601 is a major molecular part, and R1 and R2 are one or two of alkene, alkyne, a carbonyl group, a mercapto group, and a hydroxyl group, for example, —CH2CH2CH2COCH2CH2CH2CH3. The major molecular part of the material of the light emitting layer may be a quantum dot, Ir(ppy)3 or the like.

In an exemplary embodiment, the specific method of synthesizing the photocurable functional groups or the photodegradable groups into the material of the transport layer, the injection layer and the light emitting layer is to replace some of reaction materials in the reaction with analogues containing R1 and R2 groups, then the material for the transport layer, the injection layer, and the light emitting layer, which contains the photocurable functional groups or the photodegradable groups can be obtained. For the quantum dot light emitting layer, a ligand containing R1 and R2 can be selected among its ligand.

Figure 3:
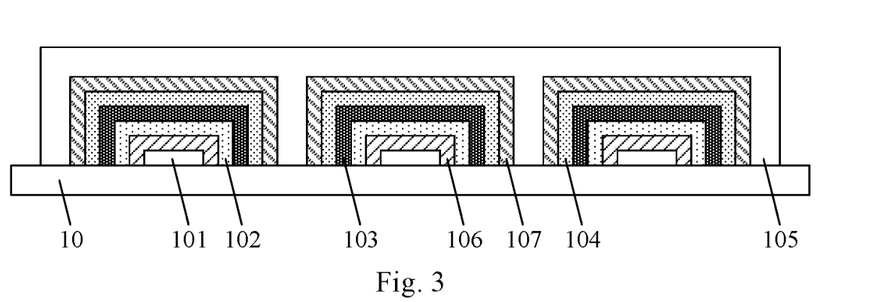
FIG. 3 is a structural schematic diagram schematically illustrating a pixel structure according to an exemplary embodiment of the present disclosure.
Figure 4:
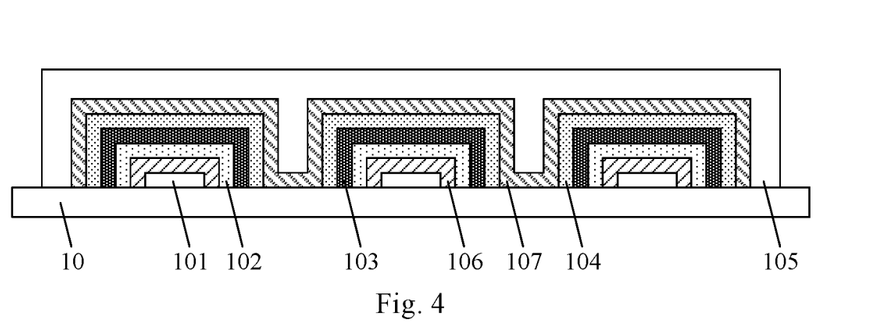
FIG. 4 is a structural schematic diagram schematically illustrating a pixel structure according to an exemplary embodiment of the present disclosure.
Figure 5:
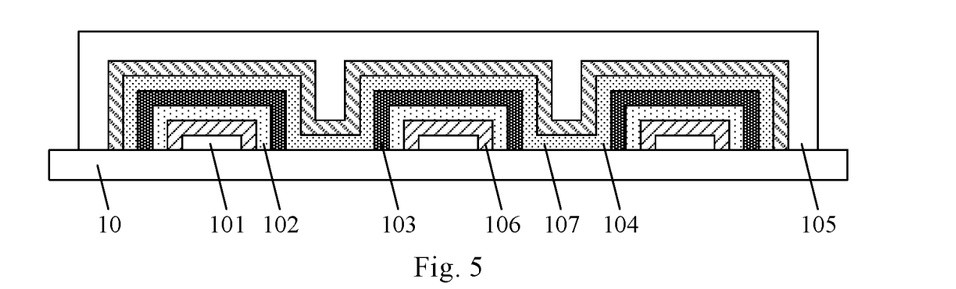
FIG. 5 is a structural schematic diagram schematically illustrating a pixel structure according to an exemplary embodiment of the present disclosure.

In the above described embodiment, the second functional layer includes the electron transport layer and the hole transport layer. In an exemplary embodiment, taking consideration of the problem of charge injection efficiency, as shown in FIGS. 3 to 5, the OLED array substrate may further include an electron injection layer and the hole injection layer. That is, the second functional layer may include the electron transport layer and the hole transport layer. The detailed structure is described as follow:

a first injection layer 106 disposed between the first electrode 101 and the first transport layer 102, wherein the first injection layer 106 may be coated on a side of the first electrode 101 facing away from the base substrate 10, and the first transport layer 102 is coated on a side of the first injection layer 106 facing away from the base substrate 10; and/or a second injection layer 107 disposed between the second transport layer 104 and the second electrode 105, wherein the second injection layer 107 is coated or paved on a side of the second transport layer 104 facing away from the base substrate 10.

When the first transport layer 102 is an electron transport layer and the second transport layer 103 is a hole transport layer, the first injection layer 106 is an electron injection layer, and the second injection layer 107 is a hole injection layer. When the first transport layer 102 is a hole transport layer and the second transport layer 103 is an electron transport layer, the first injection layer 106 is a hole injection layer, and the second injection layer 107 is an electron injection layer.

In an exemplary embodiment of the present disclosure, the electron injection layer, the electron transport layer, the hole injection layer and the hole transport layer are the above described second functional layer.

In this embodiment, as for the structure positioned above the light emitting layer 103, a cladding structure or a paved structure may be adopted. For example, the second injection layer 107 shown in FIG. 3 is a cladding structure, and the second injection layer 107 shown in FIGS. 4 and 5 is a paved structure. It should be noted, however, that the structure of the second injection layer 107 is also related to the structure of the second transport layer 104. Referring to FIGS. 3 and 4, when the second transport layer 104 is a cladding structure, the second injection layer 107 may be a cladding structure or a paved structure; and referring to FIG. 5, when the second transport layer 104 is a paved structure, the second injection layer 107 can only be a paved structure.

It should be noted that the first injection layer 106 and the second injection layer 107 can be used to improve electron injection efficiency or hole injection efficiency. In this embodiment, a charge injection layer can be selected to be formed or not according to actual needs, and when the charge injection layer is formed, only the first injection layer 106 may be formed, or only the second injection layer 107 may be formed, or both the first injection layer 106 and the second injection layer 107 may be formed simultaneously, no specific limitation is imposed herein.

In this exemplary embodiment, the material of the first transport layer 102, the second transport layer 104, the first injection layer 106, and the second injection layer 107 may include photocurable functional group or photodegradable group.

In an exemplary embodiment, the photocurable functional group may produce crosslinking reaction under illumination conditions such as under irradiation of ultraviolet light. The photocurable functional group is, for example, one or more of alkenyl, dienyl, alkynyl, diynyl, phenyl, carbonyl, sulfydryl, which produce photocuring reaction to form a crosslinked network structure, thereby performing the function of material fixation.

When the first transport layer 102 is formed using a material including photocurable functional group, firstly, a film layer of a photocurable functional group is formed on the first electrode 101, and the film layer is covered with a mask with pattern. Then, ultraviolet light irradiation treatment is performed on the mask. The portion covered by the mask is not cured due to the protection of the mask, and the portion not covered by the mask is cured by ultraviolet light. After the subsequent solvent treatment, the cured portion is maintained on the first electrode 101 and formed as the first transport layer 102. The second transport layer 104, the first injection layer 106, and the second injection layer 107 are formed in the same manner as the first transport layer 102, and are not described herein again. Similarly, as the first transport layer 102, the second transport layer 104, the first injection layer 106, and the second implant layer 107 are formed of a material including photodegradable group, a photolithography process can be adopted for their fabrication, so that expensive evaporation processes are not required. In addition, in the photolithography process, since the material including photocurable functional group is used, the use of a photoresist is not required, thereby further reducing cost and process complexity.

In an exemplary embodiment, the photodegradable group may produce chain scission or degradation reaction under illumination conditions such as under irradiation of ultraviolet light. The photodegradable group is, for example, a metal-organic frame, a carbonyl group, an epoxy group on a long-chain molecule, which may undergo photodegradable reaction but cannot form a crosslinked network structure, thereby failing to perform the function of curing.

When the first transport layer 102 is formed using a material including photodegradable group, firstly, a film layer of a photodegradable group is formed on the first electrode 101, and the film layer is covered with a mask with pattern. Then, ultraviolet light irradiation treatment is performed on the mask. The portion covered by the mask is not degraded due to the protection of the mask, and the portion not covered by the mask is degraded by ultraviolet light.

After the subsequent solvent treatment, the undegraded portion is maintained on the first electrode 101 and formed as the first transport layer 102. The second transport layer 104, the first injection layer 106, and the second injection layer 107 are formed in the same manner as the first transport layer 102, and are not described herein again. Similarly, as the first transport layer 102, the second transport layer 104, the first injection layer 106, and the second implant layer 107 are formed of a material including photodegradable group, a photolithography process can be adopted for their fabrication, so that expensive evaporation processes are not required. In addition, in the photolithography process, since the material including photocurable functional group is used, the use of a photoresist is not required, thereby further reducing cost and process complexity.

A structure of the first transport layer 102, the second transport layer 104, the first injection layer 106, and the second implant layer 107 is as shown in FIG. 6, wherein the middle part 601 is a major molecular part, and R1 and R2 are one or two of alkene, alkyne, a carbonyl group, a mercapto group, and a hydroxyl group, for example, —CH2CH2CH2COCH2CH2CH2CH3.

The major molecular part of the material of the transport layer may be a triphenylamine analogue and derivatives thereof, TPD or the like. The major molecular part of the material of the first injection layer 106 and the second injection layer 107 may be PEDOT, PSS or the like; in addition, the material of the injection layer may be an inorganic substance such as MoOx or NiOx, which may be patterned by using photolithography and etching processes without making additional modifications to the molecule itself.

In an exemplary embodiment, the specific method of synthesizing the photocurable functional groups or the photodegradable groups into the material of the transport layer, the injection layer and the light emitting layer is to replace some of reaction materials in the reaction with analogues containing R1 and R2 groups, then the material for the transport layer and the injection layer. In this exemplary embodiment, as the material of the first transport layer 102, the second transport layer 104, the light emitting layer 103, the first injection layer 106, and the second injection layer 107 may include photocurable functional group or photodegradable group, a photolithography process can be adopted for their fabrication. The photolithography process can decrease the difficulty of fabricating processes and reduce costs.

In an exemplary embodiment, there is provided a light emitting diode display including the above described OLED array substrate, the OLED array substrate may include a plurality of different pixel structures emitting different colors of light, such as emitting red, green, and blue light. The thickness of each of the functional layers in different pixel structures is not completely the same. The functional layers include the first transport layer, the second transport layer, the first injection layer, and the second injection layer.

Figure 7:
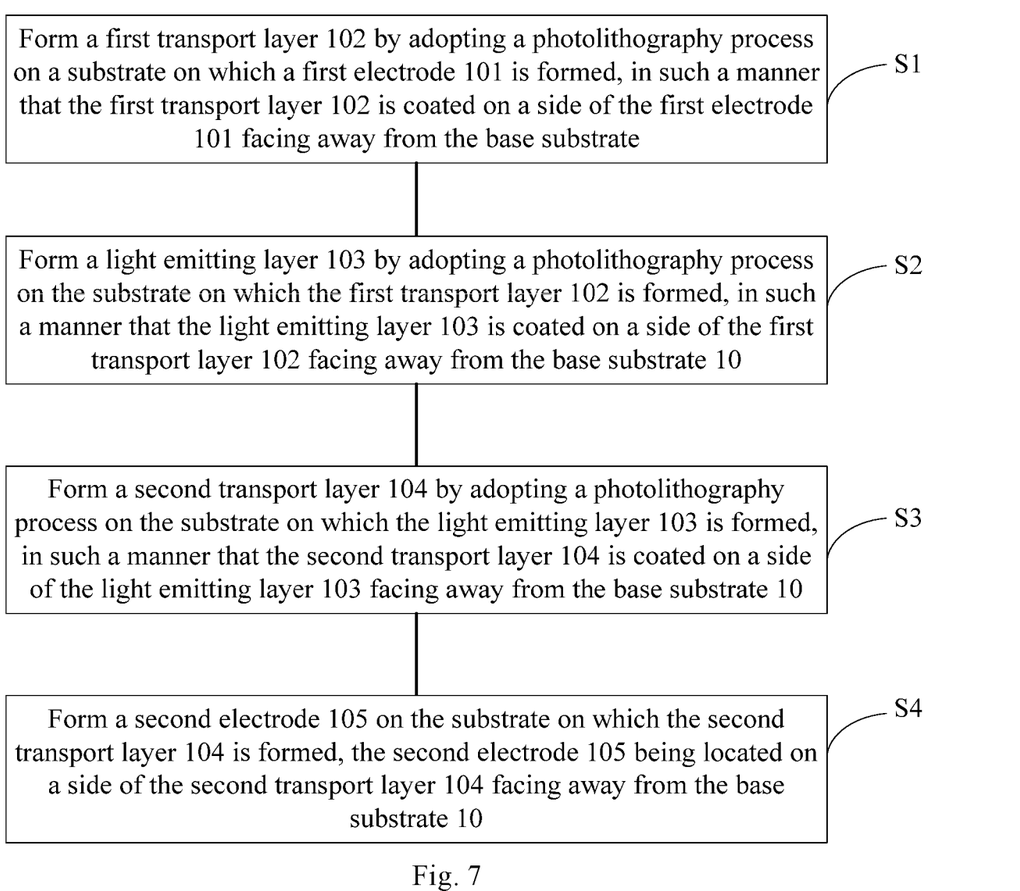
FIG. 7 is a flow chart schematically showing a method of fabricating a pixel structure according to an exemplary embodiment of the present disclosure.

The present exemplary embodiment provides a method of fabricating an OLED array substrate that can be used in an OLED display or a QLED display. As shown in FIG. 7, the method for fabricating the OLED array substrate may include the following steps.

In step S1, a first transport layer 102 is formed by a photolithography process on a substrate, on which a first electrode 101 is formed, in such a manner that the first transport layer 102 is coated on a side of the first electrode 101 facing away from the base substrate 10. In this step, the way of forming the first transport layer 102 coated on the first electrode 101 is that an exposure area of the first transport layer 102 is larger than an exposure area of the first electrode 101. The specific means include, but are not limited to, the following two types: one is to adjust an area of a mask of the first transport layer 102 in such a manner it is larger than an area of a mask of the first electrode 101; and the other is to increase a distance between the mask of the first transport layer 102 and the substrate, in such a manner that the distance is larger than a distance between the mask of the first electrode 101 and the substrate. By the above-described two means, the exposure area of the first transport layer 102 may be made larger than the exposure area of the first electrode 101, thereby obtaining a structure in which the first transport layer 102 covers on the first electrode 101.

In step S2, a light emitting layer 103 is formed by a photolithography process on the substrate, on which the first transport layer 102 is formed, in such a manner that the light emitting layer 103 is coated on a side of the first transport layer 102 facing away from the base substrate 10. The way of forming the light emitting layer 103 which covers the first transport layer 102 is the same as that in the step S1, so that an exposure area of the light emitting layer 103 is larger than the exposure area of the first transport layer 102, which will not be elaborated herein.

In step S3, a second transport layer 104 is formed by a photolithography process on the substrate, on which the light emitting layer 103 is formed, in such a manner that the second transport layer 104 is coated on a side of the light emitting layer 103 facing away from the substrate 10. The way of forming the first transport layer 104 which covers the light emitting layer 103 is the same as that in the step S1, so that an exposure area of the first transport layer 104 is larger than the exposure area of the light emitting layer 103, which will not be elaborated herein.

In step S4, a second electrode 105 is formed on the substrate, on which the second transport layer 104 is formed, wherein the second electrode 105 is located on a side of the second transport layer 104 facing away from the base substrate 10.

One of the first transport layer 102 and the second transport layer 104 is an electron transport layer, and the other of them is a hole transport layer. For example, the first transport layer 102 may be an electron transport layer, and the second transport layer 104 may be a hole transport layer; or the first transport layer 102 may be a hole transport layer, and the second transport layer 104 may be an electron transport layer.

It should be noted that the photolithography process refers to exposing and developing a film using a mask to transfer a pattern of the mask to a film that needs to be patterned.

With the method of fabricating the pixel structure provided by this exemplary embodiment of the present disclosure, there is no need to manufacture a pixel defining layer, rather, a structure in which the light emitting layer 103 covers the first transport layer 102 and the first transport layer 102 covers the first electrode 101 is formed, in this way, a high-resolution pixel structure is formed, meanwhile, this, on one hand, solves the problem of signal crosstalk in a high-resolution display, thereby improving display quality, and on the other hand, avoids the problem of non-uniform film thickness caused by the pixel defining layer, thereby improving product yield.

In addition, the fabricating method provided by the exemplary embodiment can be implemented by using a photolithography process, which can not only avoid the process difficulty in improving resolution during evaporation or printing processes, but also greatly improve material utilization, thereby promoting the industrialization production of the pixel structures.

The method of fabricating the pixel structure provided by the exemplary embodiment will be described in detail below with reference to the accompanying drawings.

In the step S1, the first transport layer 102 for transporting a first charge is formed by using a photolithography process on the substrate on which the first electrode 101 is formed, in such a manner that the first transport layer 102 is coated on a side of the first electrode 101 facing away from the base substrate 10.

The substrate described herein may be a backplane formed with a thin film transistor array, which may be disposed on the base substrate 10, for example, a glass substrate, a quartz substrate, or a flexible substrate such as Polyethylene terephthalate (PET).

Specifically, in this step, a gate metal layer, for example, a molybdenum thin film having a thickness of 200 nm may be deposited over the cleaned base substrate 10 and be subject to patterning process to obtain a desired gate electrode. Then a gate dielectric layer, for example, a silicon oxide film having a thickness of 150 nm, is deposited over the gate electrode. After that, a metal oxide semiconductor film, for example, an Indium Gallium Zinc Oxide (IGZO) having a thickness of 40 nm, is deposited over the gate dielectric layer and is subject to patterning process to obtain a desired semiconductor active layer. Next, a source/drain metal layer, for example, a molybdenum thin film having a thickness of 200 nm, is deposited over the semiconductor active layer, and is subject to a patterning process to obtain desired source electrode and drain electrode. Further, a passivation layer, for example, a silicon oxide film having a thickness of 300 nm, is deposited over the source electrode and the drain electrode, and is subject to a patterning process to obtain a via hole for connecting the drain electrode and the first electrode 101. Thereafter, the first electrode 101, for example, Indium Tin Oxide (ITO) or ITO/Ag/ITO is deposited over the passivation layer, and is subject to a patterning process to obtain a desired electrode pattern, and the first electrode 101 can be used as a pixel electrode such as an anode. The gate electrode, the semiconductor active layer, the source electrode and the drain electrode may constitute a thin film transistor for supplying a driving voltage to the pixel electrode, but it should be noted that the sequence of forming the thin film transistor is not limited thereto, and should be adjusted based on an actual structure, for example, a top gate structure or a bottom gate structure.

Figure 8:
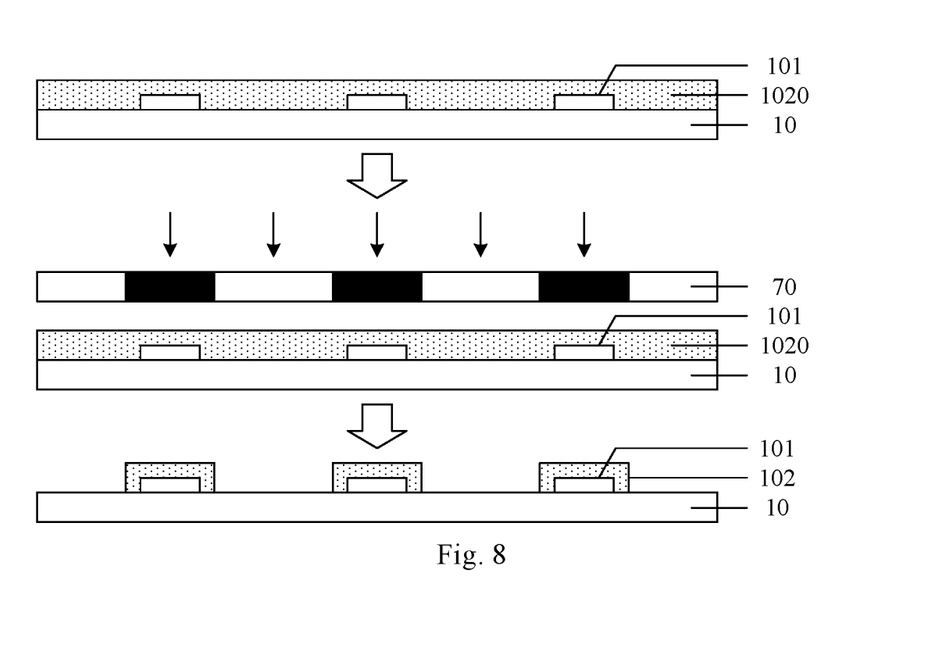
FIG. 8 is a schematic diagram schematically illustrating a procedure of fabricating a functional layer of a pixel structure according to an exemplary embodiment of the present disclosure.

On this basis, in this step, the surface of the substrate on which the thin film transistor and the first electrode 101 are formed may be cleaned by adapting a plasma treatment method, and then the first transport layer 102 is formed over the first electrode 101. As shown in FIG. 8, the method for forming the first transport layer 102 may include the step as follows: a first transport layer film 1020 for forming the first transport layer 102 is fabricated over the first electrode 101 by using a spin coating process or an evaporation process, a thickness of which can be controlled to be 20-50 nm, and then the first transport layer film 1020 is exposed, developed, and shaped using a mask 70 to obtain the first transport layer 102 which is coated on a surface of the first electrode 101. The thickness of the first transport layer 102 corresponding to the different pixel structures may differ from each other.

After the first electrode 101 is formed and before the first transport layer 102 is formed, the first injection layer 106 may be formed as needed, that is, the first injection layer 106 is formed on the substrate, on which the first electrode 101 is formed. In such a manner that the first injection layer 106 is coated on a side of the first electrode 101 facing away from the base substrate 10, and the first transport layer 102 is coated on a side of the first injection layer 106 facing away from the base substrate 10. A thickness of the first injection layer 106 can be controlled to be 20-50 nm, and the thickness of the first injection layer 106 corresponding to different pixel structures may be different, which facilitates the flexible adjustment of the luminescence efficiency of the pixel structures emitting light of different colors, to achieve the optimal luminescence effect. It should be noted that the method for forming the first injection layer 106 is similar to the method for forming the first transport layer 102, which will not be elaborated herein.

In the step S2, the light emitting layer 103 is formed by a photolithography process on the substrate on which the first transport layer 102 is formed, in such a manner that the light emitting layer 103 is coated on a side of the first transport layer 102 facing away from the base substrate 10.

The light emitting layer 103 can be an organic light emitting layer, in this embodiment, the light emitting diode display including the pixel structure is an OLED display. In an embodiment, the light emitting layer 103 can also be a quantum dot light emitting layer, and in this embodiment, the light emitting diode display including the pixel structure is a QLED display.

Specifically, in this step, the patterned light emitting layer 103, for example, a red quantum dot light emitting layer, a green quantum dot light emitting layer, and a blue quantum dot light emitting layer, may be formed on the first transport layer 102 corresponding to the pixel structures, respectively, by using the same processes as those of the first transport layer 102. A thickness of the patterned light emitting layer 103 can be controlled to be 20-50 nm, and the thickness of the light emitting layer 103 corresponding to different pixel structures may be different.

In the step S3, the second transport layer 104 for transporting a second charge and the second electrode 105 located on a side of the second transport layer 104 facing away from the base substrate 10 are formed by adopting a photolithography process on the substrate on which the light emitting layer 103 is formed.

The second transport layer 104 may be coated on the light emitting layer 103 to form a pattern of the second transport layer 104 corresponding to the different pixel structures, or may be paved on the light emitting layer 103 to form the structure of the second transport layer 104 shared by all the pixel structures. A thickness of the second transport layer 104 can be controlled to be 20-50 nm, and the thickness of the second transport layer 104 corresponding to different pixel structures may be different.

After the second transport layer 104 is formed and before the second electrode 105 is formed, the second injection layer 107 is also formed according to the needs, that is, the second injection layer 107 is formed on the substrate on which the second transport layer 104 is formed. In such a manner that the second injection layer 107 is coated or paved on a side of the second transport layer 104 facing away from the base substrate 10. A thickness of the second injection layer 107 may be controlled to be 20-50 nm, and the thickness of the second injection layer 107 corresponding to different pixel structures may be different.

Specifically, in this step, the second transport layer 104 and the second injection layer 107 may be fabricated using, for example, ZnO nanoparticles, LiF or other organic materials, over the light emitting layer 103 by a similar method to the procedure of forming the first transport layer 102. In an embodiment, a second transport layer film for forming the second transport layer 104 may be fabricated over the light emitting layer 103 by adopting a spin coating process or an evaporation process and may be subject to a patterning process to obtain the second transport layer 104 coated on a surface of the light emitting layer 103. Then a second injection layer film for forming the second injection layer 107 is fabricated over the second transport layer 104 by adopting a spin coating process or an evaporation process and is subject to a patterning process to obtain the second injection layer 107 coated on a surface of the second transport layer 104, or the second injection layer 107 paved on the surface of the second transport layer 104 may be directly obtained without being subject to the patterning process. In another embodiment, the second transport layer 104 paved on the surface of the light emitting layer 103 may be directly formed over the light emitting layer 103 by employing a spin coating process or an evaporation process, and then the second injection layer 107 paved on the surface of the second transport layer 104 is formed above the second transport layer 104 by adopting a spin coating process or an evaporation process.

On this basis, in this step, the second electrode 105, for example, a LiF:Al metal layer having a thickness of about 10-150 nm may also be formed over the second injection layer 107 by using an evaporation method, and the second electrode 105 may serve as a common electrode, for example, a cathode. After the second electrode 105 is formed, packaging and cutting can be performed, thereby completing the manufacturing of a display panel of the whole pixel structure.

Based on the above-described steps, the materials of the first transport layer 102, the second transport layer 104, the light emitting layer 103, the first injection layer 106, and the second injection layer 107 may include a photocurable functional group or a photodegradable group.

In an exemplary embodiment, the photocurable functional group may produce crosslinking reaction under illumination conditions such as under irradiation of ultraviolet light. The photocurable functional group is, for example, one or more of alkenyl, dienyl, alkynyl, diynyl, phenyl, carbonyl, sulfydryl, which produce photocuring reaction to form a crosslinked network structure, thereby performing the function of material fixation.

In an exemplary embodiment, in case that the materials of the first transport layer 102 includes a photocurable functional group, when first transport layer film 1020 is exposed, developed, and shaped by using the mask 70, a photoresist is not required. After the first transport layer film 1020 is formed over the first electrode 101, the first transport layer 1020 is covered by the mask 70. The first transport layer 1020 is subjected to ultraviolet light irradiation treatment, and the portion covered by the mask 70 is not cured by the protection of the mask 70, and the portion not covered by the mask 70 is cured by ultraviolet light. After the subsequent solvent treatment, the cured portion is retained on the first electrode 101 to form the first transfer layer 102.

In an exemplary embodiment, the photodegradable group may produce chain scission or degradation reaction under illumination conditions such as under irradiation of ultraviolet light. The photodegradable group is, for example, a metal-organic frame, a carbonyl group, an epoxy group on a long-chain molecule, which may undergo photodegradable reaction but cannot form a crosslinked network structure, thereby failing to perform the function of curing.

In an exemplary embodiment, in case that the materials of the first transport layer 102 includes a photodegradable group, when first transport layer film 1020 is exposed, developed, and shaped by using the mask 70, a photoresist is not required. After the first transport layer film 1020 is formed over the first electrode 101, the first transport layer 1020 is covered by the mask 70. The first transport layer 1020 is subjected to ultraviolet light irradiation treatment, and the portion covered by the mask 70 is not degraded by the protection of the mask 70, and the portion not covered by the mask 70 is degraded by ultraviolet light. After the subsequent solvent treatment, the undegraded portion is retained on the first electrode 101 to form the first transfer layer 102. [00119] the second transport layer 104, the light emitting layer 103, the first injection layer 106, and the second injection layer 107 the first transport layer 102, The pixel structure provided by the exemplary embodiment may be a forward structure or an inverted structure, and its light outgoing manner may be emitting light from the bottom or emitting light from the top. According to precision of the existing photolithography process, the prepared pixel structures have a minimum pitch of 10 microns and a resolution of above 800 ppi.

For the material required for the functional layers in the photolithography process, a material of a photosensitive functional layer may be used and directly exposed and developed; or the material of the functional layers is doped in photoresist, and then is exposed and developed after the doping; or the material of the functional layers is coated and then the photoresist is pin-coated to perform the photolithography process; or other methods which used in combination with or along with a special photoresist are adopted to complete the process.

Based on this, in this exemplary embodiment, with the method of fabricating the OLED array substrate of the pixel structure by adopting the photolithography process, on one hand, the process requirements for a high-precision mask and a high-precision inkjet head by an evaporation method and a printing method are avoided, thereby avoiding process difficulties resulted therefrom, and improving material utilization and product yield; on the other hand, high resolution can be achieved without preparing a pixel defining layer, and the influence of the pixel defining layer on film uniformity produced by using manufacturing procedures of a solution method, as well as the problem of signal crosstalk produced due to close distances among the pixel structures in the high-resolution device are prevented.

It should be noted that although several modules or units of a device for carrying actions are mentioned in the detailed descriptions above, such division is not mandatory. In fact, features and functions of two or more of the modules or units described above may be embodied in one module or unit in accordance with the embodiments of the present disclosure. Conversely, the features and functions of one module or unit described above may be further embodied by multiple modules or units.

In addition, although the various steps of the method of the present disclosure are described in a particular order in the figures, it is not required or implied that the steps must be performed in the particular order, or all the illustrated steps must be performed to achieve the desired result. Additionally or alternatively, some steps may be omitted, or multiple steps may be combined into one step to be performed, and/or one step is decomposed into multiple steps to be performed.

Other embodiments of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An organic light emitting diode array substrate including a plurality of pixel units, each of the plurality of pixel units comprising:
    a base substrate;
    a first electrode disposed above the base substrate;
    a light emitting layer disposed on a side of the first electrode facing away from the base substrate; and
    an electron transport layer disposed between the first electrode and the light emitting layer the electron transport layer wrapping the first electrode,
    an electron injection layer disposed between the first electrode and the electrode transport layer, the electron transport layer wrapping the electron injection layer,
    a second functional layer disposed on a side of the light emitting layer facing away from the base substrate,
    a second electrode disposed on a side of the second functional layer facing away from the base substrate,
    wherein
    the second functional layer comprises:
        a hole transport layer disposed on a side of the light emitting layer facing away from the base substrate, the hole transport layer wrapping the light emitting layer, and
        a hole injection layer disposed between the hole transport layer and the second electrode,
    wherein the second electrode is disposed on a side of the hole injection layer facing away from the base substrate the second functional layer wraps the light emitting layer.

2. The organic light emitting diode array substrate according to claim 1, wherein the light emitting layer comprises a photocurable functional group or a photodegradable group.

3. The organic light emitting diode array substrate according to claim 2, wherein the light emitting layer comprises a quantum dot light emitting layer.

4. The organic light emitting diode array substrate according to claim 3, wherein the photocurable functional group comprises one or more of an alkenyl group, an alkynyl group, a carbonyl group, a sulfhydryl group, and a hydroxyl group.

5. The organic light emitting diode array substrate according to claim 3, wherein the photodegradable group comprises a metal-organic frame or a carbonyl group on a long molecular chain.

6. The organic light emitting diode array substrate according to claim 1, wherein a material of the electron injection layer, the electron transport layer, the hole injection layer and the hole transport layer comprises a photocurable functional group or a photodegradable group.

7. The organic light emitting diode array substrate according to claim 6, wherein the photocurable functional group comprises one or more of an alkenyl group, an alkynyl group, a carbonyl group, a sulfhydryl group, and a hydroxyl group.

8. The organic light emitting diode array substrate according to claim 7, wherein the photodegradable group comprises a metal-organic frame or a carbonyl group on a long molecular chain.

9. The light emitting diode display according to claim 8, wherein each of the plurality of the pixel structure further comprises:
    an electron transport layer disposed between the first electrode and the light emitting layer, the electron transport layer wrapping the first electrode,
    an electron injection layer disposed between the first electrode and the electron transport layer, the electron transport layer wrapping the electron injection layer,
    a hole transport layer disposed on a side of the light emitting layer facing away from the base substrate, the hole transport layer wrapping the light emitting layer,
    a hole injection layer disposed between the hole transport layer and a second electrode, and
    the second electrode disposed on a side of the hole injection layer facing away from the base substrate.

10. The light emitting diode display according to claim 9, wherein thicknesses of each of second functional layers in the plurality of pixel structure are not the same; and the second functional layers comprise the electron injection layer, the electron transport layer, the hole injection layer and the hole transport layer.

11. A light emitting diode display, comprising the organic light emitting diode array substrate according to claim 1.

12. A method for fabricating an organic light emitting diode array substrate, comprising:
    forming a first electrode on a base substrate;
    forming a light emitting layer on a side of the first electrode facing away from the base substrate;
    forming an electron transport layer disposed between the first electrode and the light emitting layer, the electron transport layer wrapping the first electrode;
    forming an electron injection layer disposed between the first electrode and the electron transport layer, the electron transport layer wrapping the electron injection layer;
    forming a second functional layer on a side of the light emitting layer facing away from the base substrate;
    forming a second electrode disposed on a side of the second functional layer facing away from the base substrate;
    wherein
    the step of forming a second electrode comprises:
        forming a hole transport layer disposed on a side of the light emitting layer facing away from the base substrate, the hole transport layer wrapping the light emitting layer, and
        forming a hole injection layer disposed between the hole transport layer and the second electrode,
    wherein the second electrode is disposed on a side of the hole injection layer facing away from the base substrate, the second functional layer wraps the light emitting layer.

13. The method for fabricating an organic light emitting diode array substrate according to claim 12, wherein the light emitting layer is formed of a photocurable functional group or a photodegradable group.

14. The method for fabricating an organic light emitting diode array substrate according to claim 13, wherein the light emitting layer is formed using a photolithography process.

15. The method for fabricating an organic light emitting diode array substrate according to claim 12, the second further comprising at least one of an electron injection layer, an electron transport layer, a hole injection layer and a hole transport layer.

16. The method for fabricating an organic light emitting diode array substrate according to claim 15, wherein the electron injection layer, the electron transport layer, the hole injection layer and the hole transport layer are formed using a photolithography process.

* * * * *